United States Patent
Fohrenkamm et al.

(10) Patent No.: US 9,398,698 B2
(45) Date of Patent: Jul. 19, 2016

(54) FORMING PATTERNS OF ELECTRICALLY CONDUCTIVE MATERIALS

(71) Applicants: Elsie Anderson Fohrenkamm, St. Paul, MN (US); Charles W. Simpson, Lakeland, MN (US); Gregory Lloyd Zwadlo, River Falls, WI (US)

(72) Inventors: Elsie Anderson Fohrenkamm, St. Paul, MN (US); Charles W. Simpson, Lakeland, MN (US); Gregory Lloyd Zwadlo, River Falls, WI (US)

(73) Assignee: EASTMAN KODAK COMPANY, Rochester, NY (US)

( * ) Notice: Subject to any disclaimer, the term of this patent is extended or adjusted under 35 U.S.C. 154(b) by 245 days.

(21) Appl. No.: 14/134,085

(22) Filed: Dec. 19, 2013

(65) Prior Publication Data

US 2015/0179310 A1    Jun. 25, 2015

(51) Int. Cl.
*B05D 5/12* (2006.01)
*H05K 3/12* (2006.01)
*H05K 3/18* (2006.01)

(52) U.S. Cl.
CPC ............. *H05K 3/1275* (2013.01); *H05K 3/182* (2013.01); *H05K 2203/0143* (2013.01); *H05K 2203/1105* (2013.01); *H05K 2203/1476* (2013.01); *H05K 2203/1545* (2013.01); *Y10T 428/24479* (2015.01); *Y10T 428/24802* (2015.01)

(58) Field of Classification Search
CPC combination set(s) only.
See application file for complete search history.

(56) References Cited

U.S. PATENT DOCUMENTS

| | | | |
|---|---|---|---|
| 4,836,102 A | 6/1989 | Cicci | |
| 5,127,330 A | 7/1992 | Okazaki et al. | |
| 7,026,012 B2 | 4/2006 | Chen et al. | |
| 2004/0003734 A1 | 1/2004 | Shively et al. | |
| 2004/0188418 A1* | 9/2004 | Aisenbrey | B29C 45/0013 219/528 |
| 2006/0019079 A1* | 1/2006 | Rodriguez | B82Y 30/00 428/292.1 |
| 2007/0289459 A1 | 12/2007 | Laksin et al. | |
| 2008/0230773 A1* | 9/2008 | Dickey | B82Y 10/00 257/40 |
| 2008/0233280 A1 | 9/2008 | Blanchet et al. | |
| 2012/0137911 A1* | 6/2012 | Pekurovsky | B41F 5/24 101/491 |
| 2012/0168684 A1 | 7/2012 | Magdassi et al. | |
| 2012/0168685 A1* | 7/2012 | Kim | H01B 13/00 252/500 |
| 2014/0366759 A1* | 12/2014 | Tria | B41N 1/00 101/401.1 |

OTHER PUBLICATIONS

Wen et al., "Investigation on Post Treatment of Nano-size Silver Conductive Film," Materials Science Forum vols. 675-677 (2011) pp. 1117-1120.
Grouchko et al., "Conductive Inks with a 'Bult-In' Mechanism That Enables Sintering at Room Temperature," ACS Nano, vol. 5, No. 4, 3354-3359, 2011.
Wakuda et al., "Room Temperature Sintering of Ag Nano-scale particles with drying of the solvent," Scripta Materialia, vol. 59, Issue 6, Sep. 2008, pp. 649-652.

\* cited by examiner

*Primary Examiner* — Austin Murata
(74) *Attorney, Agent, or Firm* — J. Lanny Tucker

(57) ABSTRACT

A pattern of an electrically conductive print material is formed on a receiver element using an elastomeric relief element that has a relief pattern comprising (1) an uppermost relief surface, and (2) an average relief image depth of at least 50 μm relative to the uppermost relief surface. A printable material composition is applied to the uppermost relief surface, which printable material composition contains an electrically conductive print material and a carrier liquid. At least 50 weight % of the carrier liquid is removed from the uppermost relief surface, leaving the electrically conductive print material on the uppermost relief surface. Either the elastomeric relief element or the printable material composition on the elastomeric relief element, or both, are treated with an acid in vapor or liquid form to improve conductivity of the electrically conductive print material after it has been transferred from the uppermost relief surface to the receiver element.

14 Claims, 2 Drawing Sheets

FORMING PATTERNS OF ELECTRICALLY CONDUCTIVE MATERIALS

RELATED APPLICATIONS

Reference is made to the following and commonly assigned patent application, the disclosure of which is incorporated herein by reference:

U.S. Ser. No. 13/759,092, filed Feb. 5, 2013 by Zwadlo, Fohrenkamm, and Simpson now abandoned.

FIELD OF THE INVENTION

This invention relates to a method for forming or printing a print material in a printable material composition onto a suitable receiver element to provide a printed pattern. This printing method is carried out using an elastomeric relief element to apply (for example, laminate print) the print material in the printable material composition to a receiver element after at least some of the volatile carrier liquid is removed from the printable material composition and it is treated with certain acids.

BACKGROUND OF THE INVENTION

Relief images can be provided and used in various articles for many different purposes. For example, the electronics, display, and energy industries rely on the formation of coatings and patterns of conductive materials to form circuits on organic and inorganic substrates. Such coatings and patterns are often provided using relief imaging methods and relief image forming elements. There is also need for means to provide fine wiring in various articles.

Microelectronic devices have been prepared by photolithographic processes to form necessary patterns. Photolithography, however, is a complex, multi-step process that is too costly for the printing of electronic devices on plastic substances.

Contact printing is a flexible, non-lithographic method for forming patterned materials. Contact printing potentially provides a significant advance over conventional photolithographic techniques since contact printing can form relatively high resolution patterns for electronic parts assembly. Microcontact printing can be characterized as a high resolution technique that enables patterns of micrometer dimensions to be imparted onto a substrate surface. Contact printing is a possible replacement to photolithography in the fabrication of microelectronic devices, such as radio frequency tags (RFID), sensors, and memory and back panel displays. The capability of microcontact printing to transfer a self-assembled monolayer (SAM) forming molecular species to a substrate has also found application in patterned electroless deposition of metals. SAM printing is capable of creating high resolution patterns, but is generally limited to forming metal patterns of gold or silver for example using thiol chemistry. Although there are variations, in SAM printing a positive relief pattern provided on an element having a relief image is inked onto a substrate.

Flexography is a one method of printing or pattern formation that is commonly used for high-volume printing runs. It is usually employed for printing on a variety of soft or easily deformed materials including but not limited to, paper, paperboard stock, corrugated board, polymeric films, fabrics, metal foils, glass, glass-coated materials, flexible glass materials, and laminates of multiple materials. Coarse surfaces and stretchable polymeric films are economically printed using flexography.

Flexographic printing members are sometimes known as "relief" printing members (for example, relief-containing printing plates, printing sleeves, or printing cylinders) and are provided with raised relief images onto which ink is applied for application to a printable material. While the raised relief images are inked, the relief "floor" should remain free of ink. These flexographic printing precursors are generally supplied with one or more imageable layers that can be disposed over a backing layer or substrate. Flexographic printing also can be carried out using a flexographic printing cylinder or seamless sleeve having the desired relief image.

A method for printing with a conductive ink using a relief printing plate at high print speed is described in U.S. Patent Application Publication 2004/0003734 (Shively et al.).

U.S. Pat. No. 7,026,012 (Chen et al.) describes a method for transferring catalytic particles from a stamp to a substrate followed by plating the catalytic particles.

U.S. Patent Application Publication 2008/0233280 (Blanchet et al.) describes the use of an elastomeric stamp having a relief structure with a raised surface that is treated with heat or by other means to enhance its wettability, and then application and transfer of a functional material to form a pattern on a substrate.

While there are numerous methods described in the art to form patterns using relief images, there remains a need to find a way to consistently provide patterns with high resolution lines (for example, 10 µm or less) and feature uniformity using various printable material compositions (or what are sometimes known as "inks"). The industry has been pursuing these goals for many years with limited success and continued research is being done to achieve these goals using a wide variety of print materials. A number of problems must been addressed to achieve the desired high resolution lines.

A considerable advance in the art has been provided using the method described in copending and commonly assigned U.S. Ser. No. 13/759,092 (noted above).

Transfer of electrically conductive "inks" using the noted flexographic printing process relies upon a good release of the conductive ink from the elastomeric relief element in contact with a receiver element, good affinity of the conductive ink for the receiver element, and the compositional cohesiveness of the conductive ink. There are continued efforts to provide efficient or complete transfer of such "inks" while maintaining or improving conductivity of the conductive materials within the transferred ink.

The present invention is one effort to address one or more of these problems and to provide an improved method for printing a conductive relief image using electrically conductive compositions.

SUMMARY OF THE INVENTION

The present invention provides a method for forming a pattern of a print material on a receiver element comprising a receptive surface, the method comprising the following features:

(a) providing an elastomeric relief element that comprises a relief pattern comprising (1) an uppermost relief surface, and (2) an average relief image depth of at least 50 µm relative to the uppermost relief surface, (b) optionally treating the elastomeric relief element that comprises the relief pattern with an acid in vapor or liquid form, (c) applying a printable material composition to the uppermost relief surface of the elastomeric relief element, the printable material composition comprising an electrically conductive print material and a carrier liquid, (d) removing at least 50 weight % of the carrier liquid from the printable material composition that is disposed on the uppermost relief surface of the elastomeric relief element, leaving the electrically conductive print material on the uppermost relief surface, (e) optionally treating the printable material composition on the uppermost relief surface with an acid in vapor or liquid form to form a reacted electrically conductive print material on the uppermost relief surface, provided that the method comprises after feature (a): either at least one feature (b), at least one feature (e), or at least one of both feature (b) and feature (e), and (f) transferring the electrically conductive print material after feature (d) if no feature (e) is used, or transferring the reacted electrically conductive print material if feature (e) is used, from the uppermost relief surface to a receptive surface of a receiver element.

This invention also provides an elastomeric relief element that comprises a relief pattern comprising (1) an uppermost relief surface, and (2) an average relief image depth of at least 50 µm relative to the uppermost relief surface, the uppermost relief surface having a printable material composition thereon, the printable material composition comprising a reacted electrically conductive reacted print material and a carrier liquid, wherein:

the reacted electrically conductive print material has been obtained by reaction of an electrically conductive print material on the uppermost relief surface with an acid in vapor or liquid form, the reacted electrically conductive print material is present in the printable material composition in an amount of at least 25 weight %, and the printable material composition has a viscosity of at least 100 cps and up to and including 1500 cps.

In addition, the present invention provides a product from the method of this invention, for example, a printed electrically conductive pattern on a receiver element, which printed electrically conductive pattern comprises a reacted electrically conductive print material that has been derived by reaction of an electrically conductive print material with an acid in vapor or liquid form.

The present invention also comprises an electrically conductive article wherein the electrically conductive pattern described above in the product has been electrolessly plated. The resulting electrically conductive article can be incorporated into any suitable device such as a touch screen panel or touch screen device useful in a variety of devices.

The method of this invention provides a number of advantages for what can be known as "functional printing". For example, the method provides a means for obtaining high resolution printed patterns on various substrates (or receiver elements) using electrically conductive print materials. The high resolution line features in printed patterns are obtained by a unique series of operations including removal of at least some of the carrier liquid used to uniformly disperse and "carry" the electrically conductive print material in a printable material composition on an elastomeric relief element.

Along with the desired removal of carrier liquid, the method of this invention also includes a treatment with an acid in liquid or vapor form. Such treatment can be carried out on the elastomeric relief element before the printable material composition is applied. Alternatively, the acid treatment can be carried out after the carrier liquid has been removed from printable material composition while this composition is on the elastomeric relief element. This combination of features provides improved conductivity of the electrically conductive print material after it has been transferred and "printed" as a pattern (or image) on a receiver element.

In addition, the treatment with the acid in vapor or liquid form enables more efficient transfer of the printable material composition containing from the elastomeric relief element to a receiver element, and especially to a heated receiver element. Thus, the treatment with the acid in this manner improves the conductivity of the transferred print material without diminishing the amount that is transferred since it is also desirable to transfer as close to 100% as possible.

The printable material composition that has been treated in this manner can be transferred to a receiver element before the elastomeric relief element is separated from the receiver element. This can be considered a pattern "printing" operation. The elastomeric relief element used for this transfer can be provided in a variety of ways (described below) including but not limited to, the use of flexographic printing elements that have been appropriately imaged.

In some embodiments, it is possible to build up the print material on the elastomeric relief element either before or after treatment with the acid and before transfer of the electrically conductive print material to the receiver element. This can be done by multiple applications of the same printable material composition to the uppermost relief surface of the elastomeric relief element, and removal of at least some of the carrier liquid from the printable material composition after each application. This drier or more viscous and cohesive printable material composition can be applied to a receptive surface of the receiver element more completely. Inking systems such as high ink volume Anilox rollers cannot always be used to apply sufficient printable material composition without leaving residue of the composition on the sides of the elastomeric relief element due to spread of the printable material composition (or ink) onto the sides of the elastomeric relief element feature sides. The multiple applications of the printable material composition to the elastomeric relief element can also minimize this problem for example by allowing the use of a low volume Anilox roller for each application.

DETAILED DESCRIPTION OF THE INVENTION

Definitions

Figure 1:
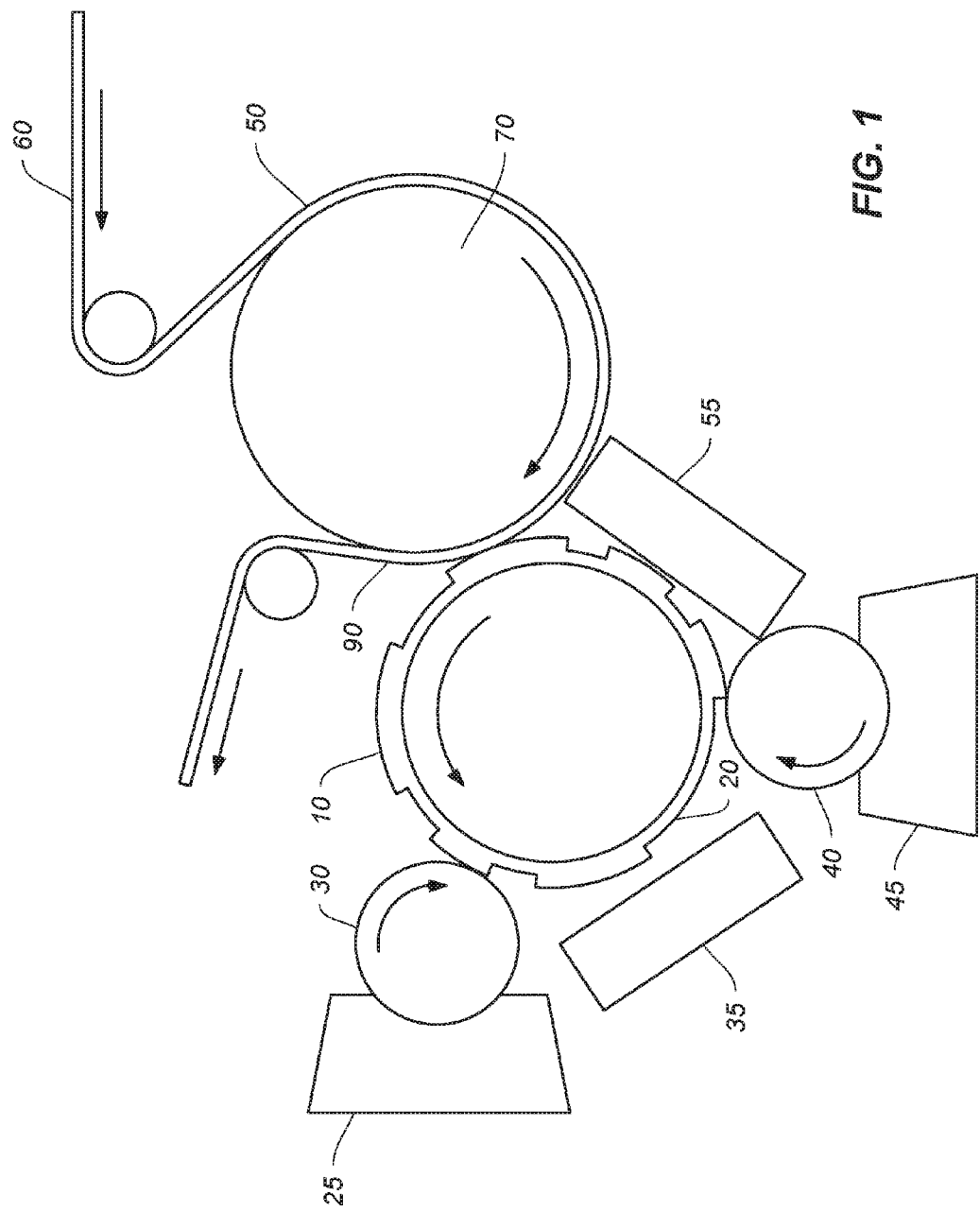
FIGS. 1 and 2 are schematic illustrations of two embodiments of equipment systems useful for carrying out the method of the present invention, as described in the Examples below.

As used herein to define various components of the printable material compositions, formulations, and elastomeric compositions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, percentages refer to percents by total dry weight, for example, weight % based on total solids of a layer, composition, or formulation. Unless otherwise indicated, the percentages can be the same for either the dry layer or the total solids of the formulation or composition used to make that layer.

The term "flexographic printing precursor" refers to some embodiments of elastomeric relief elements useful in the practice of this invention. The flexographic printing precursors include flexographic printing plate precursors, flexographic printing sleeve precursors, and flexographic printing cylinder precursors, all of which can be suitably imaged to provide a relief image to have an average relief image depth of at least 50 μm and up to and including 1000 μm, or at least 100 μm and up to and including 600 μm, relative to the uppermost relief surface. Any desired minimum and maximum relief image depths can be achieved based on a given elastomeric relief element and the printed pattern that is desired. Such elastomeric relief elements can also be known as "flexographic printing plate blanks", "flexographic printing cylinder blanks", or "flexographic sleeve blanks". The elastomeric relief elements can also have seamless or continuous forms.

The term "laser-engraveable" means that a layer can be directly imaged using a suitable laser-engraving source including carbon dioxide lasers and near-infrared radiation lasers such as Nd:YAG lasers, laser diodes, and fiber lasers. Absorption of energy provided by these lasers produces heat that causes rapid local changes in a laser-engraveable layer so that the imaged regions are physically detached from the rest of the layer or substrate and ejected from the layer and collected using suitable means. Non-imaged regions of the laser-engraveable layer are not removed or volatilized to an appreciable extent and thus form the uppermost relief surface in the printing surface for printing. The breakdown is a violent process that includes eruptions, explosions, tearing, decomposition, fragmentation, oxidation, or other destructive processes that create a broad collection of solid debris and gases. "Laser-ablative" and "laser-engraveable" can be used interchangeably in the art, but for purposes of this invention, the term "laser-engraveable" is used to define imaging in which a relief image is formed in the elastomeric relief element. It is distinguishable from image transfer methods in which ablation is used to materially transfer pigments, colorants, or other image-forming components.

Uses

The method of this invention can be used in many ways to form a pattern of an electrically conductive print material on a suitable receiver element for use in devices and for components in a variety of applications including but not limited to, electronic, optical, sensory, and diagnostic devices. More details of such uses are provided below. A variety of electrically conductive print materials useful as the print material can be applied to the receiver material using a suitable elastomeric relief element described herein. In particular, it is desired to use the present invention to provide patterns of such electrically conductive print materials on receiver elements comprising lines having a line resolution (line width) of less than 50 μm, or less than 15 μm, or even less than 10 μm and as low as 1 μm.

Such electrically conductive patterns can be incorporated into electronic and optical devices and components that include but are not limited to, radio frequency tags (RFID), sensors, touch screen panels and devices containing same, and memory and back panel displays. The electrically conductive patterns can be designed to be temperature-sensitive or pressure-sensitive as well.

In particular, the present invention is useful for providing electrically conductive patterns on receiver elements that are designed for use as touch panel displays. Such electrically conductive patterns can be provided using print materials, such as electrically conductive metals and metallic salts that are or can be processed or treated in some manner to become electrically conductive. Useful print materials of this type include but are not limited to, silver and silver salts such as silver halides, and silver behenate and other organic silver salts. Such electrically conductive metal patterns can be further processed for example using electroless metal plating.

Print Materials and Printable Material Compositions

In some embodiments, the term "electrically conductive print material" refers to a material that is electrically conductive and can be organic, inorganic, or comprise both organic and inorganic components. Such electrically conductive print materials exhibit a predetermined activity in response to at least an electrical potential even though the electrically conductive print material can also be responsive to other stimuli. Examples of electrically conductive print materials include but are not limited to, conductive polymers, nanoparticles of indium-tin oxide, metals such as gold, silver and silver precursors, copper, and palladium, metal complexes, metal alloys, and combinations thereof. An electrically conductive print material can alternatively be an electrically conductive material precursor such as a metal salt (for example a silver salt like a silver halide or an organic silver salt), or an electroless metallization catalyst such as palladium particles. Particularly useful electrically conductive print materials include silver and silver salts, gold, copper, palladium, platinum, nickel, iron, indium-tin oxide, carbon blacks, and combinations thereof.

Electrically conductive print materials can be of any form including particulate, polymeric materials, small molecule materials, and other forms that would be apparent to a skilled worker. For example, useful particulate or film-forming polymeric electrically conductive print materials that are electrically conductive polymers include but not limited to, homopolymers and copolymers comprising polythiophenes, polyanilines, polypyrroles, polycarbazoles, polyindoles, polyazepines, polyethylenedioxythiophenes, poly(3-alkylthiophenes), poly(p-phenylene vinylene)'s, poly(p-phenylene)'s, poly(styrene sulfonic acid) (PSS), poly(p-phenylene sulfide), polyacetylene, poly(3,4-ethylene dioxythiophene) (PEDOT), and a mixture of poly(styrene sulfonic acid) and poly(3,4-ethylene dioxythiophene) (PSS:PEDOT).

It is also possible that the electrically conductive print materials are used in the form of nanoparticles. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters. The shape of the nanoparticles is not limited and includes nanospheres, nanorods, and nanocups. Moreover, the electrically conductive print materials also include nanoparticles of carbon such as carbon black, carbon nanotubes, electrically conducting carbon nanotubes, graphene, and carbon black conducting polymers. Metal nanoparticles and dispersions of gold, silver, palladium, platinum, and copper are also useful in this invention.

More particularly, the printable material composition used in this invention comprises nanoparticles of an electrically conductive material selected from the group consisting of silver, gold, copper, palladium, platinum, nickel, iron, indium-tin oxide, or combinations thereof. Precursors of such metals, such as salts or metal-ligand complexes of each metal, can also be used. For example, in some very useful embodiments, the printable material composition comprises an electrically conductive print material that comprises nanoparticles of an inorganic or organic silver salt such as a silver halide, silver behenate, and other silver salts that would be readily apparent to one skilled in the art.

It has been found particularly useful to use printable material compositions comprising an electrically conductive print material that comprises nanoparticles of a silver using an elastomeric relief element (described below) that is a flexographic printing member such as a flexographic printing plate. In such embodiments, when the printable material composition on the elastomeric relief element is treated with an acid [using feature (e)], it is best not to use a sulfur-containing acid such as sulfuric acid, as sulfur reacts with silver which causes loss of conductivity.

In general, one or more electrically conductive print materials can be dispersed, dissolved, or suspended in a suitable carrier liquid, forming a printable material composition for application to a receiver material using the elastomeric relief element described herein. The carrier liquid used for the printable material composition is not limited and can include organic compounds and aqueous compounds. For example, the carrier liquid can be an organic compound that is an alcohol-based compound. The carrier liquid can be a solvent that is capable of dispersing or suspending the electrically conductive print material in solution sufficient to carry out the method of this invention.

The carrier liquid and the electrically conductive print material (and any optional components) comprising the printable material composition should at least be capable of wetting at least the uppermost relief surface of the elastomeric relief element during the method of this invention. The carrier liquid can have some volatility, and can also cause a certain amount of swelling in the elastomeric relief element, depending upon the type of composition from which the elastomeric relief element is prepared. Any swelling in the elastomeric relief element can be reduced when the carrier liquid is removed from the printable material composition. In addition, it is advantageous to use a carrier liquid that will not attack or adversely affect the stability and dimensional size of the elastomeric relief element or receiver element. A skilled worker can readily make a judicious choice of carrier liquid depending upon the materials used for the elastomeric relief element and the receiver element, and the particular electrically conductive print material to be used.

The carrier liquid can also include one or more compounds as a solvent for the print material. For example, the carrier liquid can include one or more solvents for the electrically conductive print material (for example, if it is a film-forming electrically conductive polymer). In other embodiments, the carrier liquid comprises two or more solvents, for example a co-solvent mixture, for the electrically conductive print material. The solvent mixtures can be chosen using various criteria such as the evaporation rate (volatility) of the individual solvents, and the solvating or dispersing power of the individual solvent components for a particular electrically conductive print material. Further details of such solvents are provided in paragraph [0046] of U.S. Patent Application 2008/0233280 (noted above).

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, before a portion of the carrier liquid is removed in feature (d) of the present invention, the printable material composition comprising the carrier liquid and electrically conductive print material has a viscosity of at least 1 cps and up to and including 1500 cps, or typically of at least 100 cps and up to and including 900 cps, or up to and including 1000 cps. Some highly viscous printable material compositions can be used in the practice of this invention, and have a viscosity of at least 1500 cps to and including 5000 cps. Viscosity can be measured using a conventional means and equipment such as a Brookfield Viscometer DV-II+Pro (Brookfield Engineering Laboratories).

Some particularly useful electrically conductive print materials include but are not limited to, electrically conductive inks containing electrically conductive particles such as metal flakes or particles. Electrically conductive inks include electrically conductive silver-containing inks (such as inks comprising silver nanoparticles), gold-containing inks, copper-containing inks, carbon-containing inks, palladium-containing inks, and other inks containing "seed" materials for electroplating or electroless plating. Some of such inks can be obtained commercially from sources such as InkTec (California), Flint Ink Corporation (Michigan), and Method Development Company (Chicago). Some of these "inks" can be used as a carrier liquid while other inks comprise both a carrier liquid and an electrically conductive print material.

Thus, such printable material compositions (or "inks") can comprise electrically conductive print materials that are suspended in suitable carrier solvents as described above and that are known in the art for this purpose. For example, a silver-containing electrically conductive printable material composition can include any useful amount of silver metal particles that are dispersed in aqueous or non-aqueous carrier solvents.

In some embodiments, the printable material composition can further comprise a colorant besides the electrically conductive print material. Such colorants can include but not limited to, dyes, optical absorbers, pigments, opacifiers, and any material that modifies the transmissive or reflective property of the printable material composition at any time during the method of this invention.

Elastomeric Relief Elements

The elastomeric relief elements useful in the practice of this invention can be comprised of one or more elastomeric layers, with or without a substrate, in which a relief image can be generated using suitable imaging means. For example, the relief layer comprising a relief pattern can be disposed on a suitable substrate.

For example, the elastomeric relief element (for example, flexographic printing member) having a relief layer comprising an uppermost relief surface and an average relief image depth (pattern height) of at least 50 µm, or typically having an average relief image depth of at least 100 µm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference for details of such precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for provide elastomeric relief images are also described in the noted Ali et al. patent.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.).

However the relief image is provided, its elastomeric relief layer is designed such that the elastomeric relief element has a modulus of elasticity of at least 2 megaPascals but less than 10 megaPascals, or typically of at least 4 megaPascals and up to and including 8 megaPascals, as determined for example, using a Digital Durometer HPE-II Series (Qualitest USA LC), Instron Model 5942 Single Column Table Top Materials Testing System, Texture Technologies TA-XT2i Benchtop Materials Tester, or Rheometrics Solids Analyzer Model RSAII DMA, particularly when the elastomeric relief element is a flexographic printing member. The relationship between Shore A hardness (indentation) and Young's Modulus is described by A. N. Gent, "On the Relation between Indentation Hardness and Young's Modulus", *Rubber Chemistry and Technology: September* 1958. Vol. 31, No. 4, pp. 896-906, 1958.

As noted above, average relief image depth (relief pattern) or an average relief pattern height in the relief pattern is at least 50 µm or typically at least 100 µm relative to the uppermost relief surface. A maximum relief image depth (relief pattern) or relief pattern height can be as great as 1,000 µm, or typically up to and including 750 µm, relative to the uppermost relief surface. The relief pattern generally has a shoulder angle of greater than 25° and up to and including 85°, or typically at least 50° and up to but less than 75°, relative to a vertical line from the lowest recess to the uppermost relief surface (that is, the higher should angle of 85° would be closer to the horizontal dimension parallel with the uppermost relief surface). Shoulder angle can be measured as described in FIG. 4 of U.S. Pat. No. 7,799,504 (noted above) the disclosure of which is incorporated herein by reference for details of this measurement.

Methods for Forming Patterns

In feature (a) of the present invention, the method of this invention includes the provision of an elastomeric relief element described herein to print a suitable pattern of an electrically conductive print material on a receiver element. The present invention enables printing of a variety of electrically conductive print materials over relatively large areas with desirable resolution (for example, a line width of less than 20 µm or even less than 15 µm). In some embodiments, the resolution (line width) can be as low as 5 µm or even as low as 1 µm. The method also provides a means for printing of sequential overlying patterns without hindering the utility of one or more underlying layers. The method can be adapted to high-speed production processes for the fabrication of electronic devices and components.

In some embodiments, the elastomeric relief element comprising a relief pattern as described above is treated with an acid in vapor or liquid form, as in feature (b) of the method of this invention. At this point, the printable material composition has not been applied to the relief image. Any useful organic or inorganic acid can be used for this purpose, including but not limited to hydrochloric acid (HCl), nitric acid ($HNO_3$), acetic acid ($CH_3COOH$), oxalic acid (HOOC—COOH), and sulfuric acid ($H_2SO_4$). Acetic acid and hydrochloric acid are particularly useful and hydrochloric acid is most useful in either vapor or liquid form.

Such acid treatment can be carried out in any suitable manner including immersing the entire elastomeric relief element in an acidic solution of any suitable concentration that will not adversely affect the elastomeric relief element (for example at least 0.001 molar and up to and including 1.0 molar acid solution), wiping the acidic solution over the relief image, or spraying the acidic solution onto the relief image. Alternatively, the relief image can be contacted with an acid in vapor form. The various acidic contacting can be carried out for any suitable length of time, for example at least 0.1 seconds and up to and including 5 minutes, and at a suitable temperature of for example room temperature (about 20° C. and up to and including 80° C.

In feature (c) of the present invention, printable material compositions containing the electrically conductive print material can applied in a suitable manner to the uppermost relief surface (raised surface) in the elastomeric relief element. Application of the printable material composition can be accomplished using several suitable means and it is desirable that as little as possible is coated onto the sides (slopes) or recesses of the relief depressions. Thus, it is desirable that as much as possible of the printable material composition is applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives are used in flexographic printing presses are particularly advantageous for this application of the printable material composition. Spin coating techniques and dip coating techniques are generally not suitable for this application because the printable material composition can be spread onto the sides of the elastomeric relief element relief features and even onto the floor or non-printing areas of the elastomeric relief element. Optimum metering of the printable material composition onto the uppermost relief surface only can be achieved by controlling the printable material composition viscosity or thickness, or choosing an appropriate application means.

As noted above, the printable material composition (before the carried liquid is removed) can have a viscosity during this application of at least 1 cps (centipoise) and up to and including 1500 cps, or at least 1 cps to and up to and including 1500 cps.

The printable material composition can be applied at any time after the relief image is formed within a relief element precursor. The printable material composition can be applied by any suitable means, including the use of an Anilox roller system, which can be one of the most useful ways for application to the uppermost relief surface. The thickness of the functional material composition on the relief image is generally limited to a sufficient amount that can readily be transferred to the receiver element but not too much to flow over the edges of the relief element in the recesses when the functional material composition is applied to the relief element.

After the printable material composition has been applied to the uppermost relief surface (or raised surface) of the relief element, at least 25 weight % of the original carrier liquid is removed in feature (d) from the printable material composition on the uppermost relief surface of the elastomeric relief element. In most embodiments, at least 50 weight % of the carrier liquid is removed from the printable material composition on the uppermost relief surface of the elastomeric relief element, or typically at least 75 weight %, or even at least 80 weight %, of the carrier liquid is removed. Thus, the carrier liquid of the printable material composition can be removed sufficiently to form a viscous deposit of the electrically conductive print material on at least the uppermost relief surface of the relief image.

Carrier liquid removal can be achieved in any manner, for example using jets of hot air, evaporation at room temperature, or heating in an oven at an elevated temperature, or other means known in the art for removing a solvent. In one embodiment, the carrier liquid can be removed by drying during the application of the printable material composition to the uppermost relief surface. Effective drying can be assisted by selecting a carrier solvent(s) that has a relatively low boiling point or by application of a thinner layer of the printable material composition.

In some embodiments, the cycle of feature (c) applying the printable material composition to the uppermost relief surface of the elastomeric relief element, and feature (d) removing at least 25 weight % (or at least 50 weight %) of the carrier liquid from the printable material composition, in this sequence, can be repeated at least once, using an additional amount of the same printable material composition and the same elastomeric relief element, in each cycle. This disposes an increased amount of electrically conductive print material on the uppermost relief surface, and increases the optical density of the resulting pattern of electrically conductive print material on the receiver element, for example to provide an average density of at least 3.5 as measured by an X-Rite 360 spectrophotometer, or increases the electrical conductivity of the resulting pattern. The repetition of the noted sequence of features also maintains printed feature resolution and continuity while filling any potential voids in the desired printed regions of the pattern. There can be sufficient time between multiple applications of printable material composition so that sufficient amounts of carrier liquid can be removed using any suitable means of solvent removal as described above. Such repeating of the applying and removing features (c) and (d) described above, in the noted sequence, can be carried out after the acid treatment of feature (b) may be used, or before the acid treatment of feature (e) is used.

After feature (d) is carried out, the printable material composition on the uppermost relief surface can be acid treated in feature (e) using a suitable organic or inorganic acid in vapor or liquid form to form a reacted electrically conductive print material on the uppermost relief surface. It is particular useful to use the acid in vapor form. Useful organic or inorganic acids for feature (d) can be any of those described above for feature (b). It is particularly useful for this acid treatment that nitric acid, acetic acid, or hydrochloric acid is used in vapor or liquid form. As noted above, when the electrically conductive print material contains silver, sulfuric acid is particularly excluded from this treatment in feature (e). Hydrochloric acid is particularly useful especially after repeated cycles of features (c) and (d) treatments described above.

It is particularly desirable to tailor the particular electrically conductive print material and the acid for the treatment, especially in feature (e). Routine experimentation with various acids, times and temperatures for treatment, and various electrically conductive print materials can be used to choose the optimal combination of treatment conditions for desired conductivity on and transport to the receiver element (described below).

The acid treatment in feature (e) can be carried out for a least 0.1 seconds and for up to and including 5 minutes, depending upon the concentration and form of the acid (vapor or liquid). For example, when the acid is provided in liquid form, the printable material composition can be treated with a solution of the acid (for example hydrochloric acid) at a concentration of at least 0.01 molar for at least 1.0 seconds at a temperature of at least 20° C. When an acidic vapor is used, the treatment time can be at least 0.5 seconds and carried out at a temperature of at least 20° C.

In some embodiments of the method of this invention only feature (e), but not feature (b), is carried out at least once. For example, this at least one feature (e) using nitric acid, acetic acid, or hydrochloric acid in vapor or liquid form. More particular, the at least one feature (e), but not feature (b), can be carried out using hydrochloric acid in vapor or liquid form.

In other embodiments, the methods of this invention comprise at least one feature (e) but not feature (b) and further comprise after feature (a):

repeating features (c) and (d), in the noted sequence, at least once using additional amounts of the same printable material composition and the same elastomeric relief element, to provide an increased amount of rather viscous electrically conductive print material disposed on the uppermost relief surface.

For example, such embodiments [when features (c) and (d) are repeated] can comprise at least one feature (e) but not feature (b) using hydrochloric acid in vapor or liquid form.

In yet other embodiments, the method of the present invention comprises at least one feature (b) and at least one feature (e) using the same acid (for example hydrochloric acid in vapor or liquid form) in both features (b) and (e). In such embodiments, the sequence of features (c) and (d) can be carried out one or more times in the method of this invention.

In still other embodiments, the method of the present invention comprises at least one feature (b) and at least one feature (e) using different acids in the two features (for example acetic acid in one feature and hydrochloric acid in the other feature, in either vapor or liquid form). In such embodiments, the sequence of features (c) and (d) can be carried out one or more times in the method of this invention.

A receiver element is provided on which a desired pattern is formed using the elastomeric relief element. This receiver element can be composed of any suitable material including but are not limited to, polymeric films, metals, silicon or ceramics, fabrics, papers, and combinations thereof (such as laminates of various films, or laminates of papers and films) provided that a pattern of an electrically conductive print material can be formed from the printable material composition on at least one receptive surface thereof. The receiver element can be transparent or opaque, and rigid or flexible. The receiver element can include one or more polymeric or non-polymeric layers or one or more patterns of other materials before the pattern of electrically conductive print material is applied according to the present invention. A surface of the receiver element can be treated for example with a primer layer or electrical or mechanical treatments (such as graining) to render that surface a "receptive surface" to achieve suitable adhesion of the electrically conductive print material or of a separate adhesive layer. An adhesive layer can be disposed on a substrate in the receiver element and this adhesive layer can have various properties in response to heat (thermally activatable, solvent activatable, or chemically activatable) that serves as a receptive layer and aids in the transfer or adhesion of the pattern of electrically conductive print material. Useful adhesive materials of this type are described for example in [0057] of U.S. Patent Application 2008/0233280 (noted above).

In most embodiments, the receiver element comprises a separate receptive layer as the receptive surface disposed on a substrate, which receptive layer and substrate can be composed of a material such as a suitable polymeric material that is highly receptive of the printable material composition. In particular, the receptive layer can be chosen from the materials described above that are receptive to the printable material composition that forms the desired pattern on the receiver element with high resolution. The receptive layer generally has a dry thickness of at least 0.05 µm and up to and including 10 µm, or typically of at least 0.05 µm and up to and including 3 µm, when measured at 25° C.

A surface of the substrates can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.), to make that surface more receptive to the printable material composition.

Suitable substrates in the receiver elements include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The receiver element substrate can also include one or more charge injection layers, charge transporting layers, and semi-conducting layers on which the printable material composition pattern is formed.

Particularly useful substrates are polyesters films such as poly(ethylene terephthalate), polycarbonate, or poly(vinylidene chloride) films that have been surface-treated as noted above, or coated with one or more suitable adhesive or subbing layers, the outer layer being receptive to the printable material composition. A useful outer layer can be a vinylidene chloride polymer containing layer.

Useful substrates can have a desired dry thickness depending upon the eventual use of the receiver element, for example its incorporation into various articles or devices (for example optical devices or optical panels). For example, the dry thickness can be at least 0.001 mm and up to and including 10 mm, and especially for polymeric films, the dry thickness can be at least 0.008 mm and up to and including 0.2 mm.

Before contact of the receiver element with the printable material composition, the receiver element can be heated, although heating is not required in all embodiments. But when receiver element is heated, it is heated to a heating temperature that is higher than the glass transition temperature ($T_{gl}$) of the receptive surface to form a heated receiver element. Glass transition temperatures can be determined using Differential Scanning Calorimetry. In general, the receiver element is heated to a heating temperature that is at least 10° C. higher than the $T_{gl}$. For example, the receiver element can be heated to a heating temperature that is higher than $T_{gl}$ by at least 10° C. and up to and including 100° C. before significant distortion or decomposition of the heated receiver element. The time and manner for this heating and manner would be readily determined by a skilled worker, for example using a suitable heating oven or hot surface. In some embodiments such as when the heated receiver element is heat-stabilized poly(ethylene terephthalate), poly(ethylene naphthalate), or polyimide (such as Kapton), the $T_{gl}$ is at least 20° C. or at least 25° C. lower than the glass transition temperature of the substrate ($T_{gs}$). The receiver element can be provided in already heated form, and either used as provided or heated further.

In general, the receiver element can be heated to a temperature that is lower than the glass transition of the receiver element substrate ($T_{gs}$) by at least 5° C. and that is higher than $T_{gl}$ by at least 10° C. In most embodiments, the $T_{gl}$ is at least 20° C. and typically at least 25° C. lower than $T_{gs}$.

With or without the noted heating, the receiver element and the electrically conductive print material disposed on the uppermost relief surface of the are contacted such that the elastomeric relief element is compressed by at least 10 µm of its original thickness ("compression distance") or at least 50 µm and up to and including 200 µm of the original thickness. This original thickness is that of only the elastomeric relief element, and does not include any supporting means or surface, such as mounting tape, underneath the elastomeric relief element. The total thickness of the elastomeric relief element can be at least 0.4 mm or even at least 2 mm. The compression distance is generally greater for thicker elastomeric relief elements. The numbers noted above are generally for elastomeric relief elements having a total thickness of 1.14 mm. Because some of the carrier liquid is removed and the printable material composition flows minimally during this contact procedure in the present invention, a higher impression distance or compression pressure can be used compared to conventional flexography.

In this manner, the electrically conductive print material in the printable material composition (with reduced carrier liquid) disposed on the uppermost relief surface is forced into contact (laminated or embossed with) with the receiver element. In general, the receiver element and elastomeric relief element can be brought into contact very soon if the receiver element is heated, for example, within 10 milliseconds so that the heated receiver element has minimal time to cool. Alternatively, the receiver element can be maintained at a desired temperature before and during the contact with the elastomeric relief element. When heating is used to remove the carrier liquid from the printable material composition, some of the residual heat can be present during transfer of the printable material composition.

The transfer pressure can be applied to either the elastomeric relief element or the receiver element to assure contact and complete transfer of the printable material composition to the receiver element. For example, transfer of the printable material composition can be carried out by moving the uppermost relief surface of the elastomeric relief element relative to the receiver element, by moving the receiver element relative to the uppermost relief surface of the elastomeric relief element, or by relative movement of both elements to each other. In some embodiments, the printable material composition is transferred to the receiver element manually. In other embodiments, the transfer is automated such as by example, by a conveyor belt, reel-to-reel process, directly driven moving fixtures, chain, belt, or gear-driven fixtures, frictional roller, printing press, or rotary apparatus, or any combination of these methods.

The receiver element and elastomeric relief element can be kept in contact for as little as 10 milliseconds or up to 10 seconds or as much as 60 seconds or more. Once the desired contact is completed, the elastomeric relief element is separated from the receiver element to leave a desired pattern of the print material (in the printable material composition) on the receiver element (which can be cooled or it can be maintained at any suitable temperature to provide additional heat treatment such as improving conductivity from curing the printable material). At least 70 weight % of the print material that was originally disposed on the uppermost relief surface of the elastomer relief element (using one or more applications of printable material composition) is transferred to the receiver element in a desired pattern. In most embodiments, at least 90 weight % and up to and including 100 weight % of the originally disposed electrically conductive print material composition is transferred to the receiver element.

Separation of the elastomeric relief element and the receiver element can be accomplished using any suitable means including but not limited to, manual peeling apart, impingement of gas jets or liquid jets, or mechanical peeling devices.

In general, transferring the electrically conductive print material from the raised uppermost relief surface of the elastomeric relief element to the receiver element creates a pattern of the electrically conductive print material on the receiver element. The transferring can be referred to as "printing" (or lamination or embossing). The pattern of the electrically conductive print material on the receiver element can comprise lines, solid areas, dots, or a mixture of lines and solid areas in any desired pattern that text, numbers, shapes, or other images, or combinations thereof. In general, the average line width for printed lines in a pattern on the receiver element can be less than 20 µm or even less than 15 and as wide as 2 µm. Such lines can also have an average height of at least 10 nm and up to and including 4,000 µm. These average dimensions can be determined by measuring the lines in at least 10 different places and determining the width or height using known image analysis tools including but not limited to, profilometry, optical microscopic techniques, atomic force microscopy, and scanning electron microscopy.

While a particularly useful method of applying the electrically conductive print material to the receiver element include the use of flexography and the elastomeric relief element is a flexographic printing member comprising a relief image, the electrically conductive print material composition can also be applied to a receiver element using alternative appropriate printing methods that would be readily apparent to one skilled in the art using the teaching provided herein.

The method of this invention can be carried out at room temperature such as at least 17° C. to and including 30° C. but is not so limited, and can be carried out at a lower temperature down to about 5° C. or at an elevated temperature up to 200° C. provided that the heat does not harm the elastomeric relief element, the electrically conductive print material, the receiver element, or their ability to form a pattern on the receiver element.

In some of the embodiments, the method of this invention provides a printed pattern of fine lines of an electrically conductive print material containing a seed material for a subsequent electroless plating process. For example, for copper electroless plating, such seed materials include but are not limited to, metals such as palladium, tin, nickel, platinum, iridium, rhodium, and silver, or a mixture of tin and palladium.

For example, the method of this invention can be used to provide a pattern of an electrically conductive print material that is protective of an underlying uniform metal film during a subsequent etching process.

In other embodiments, the method of this invention can be used to provide a pattern of fine lines of an electrically conductive print material having an electrical conductivity that is high enough for a subsequent electroplating process. Such an electrical conductivity is at least 0.1 S/cm and the details of such processes are known in the art.

After the pattern of electrically conductive print material has been applied to the receiver element in a suitable manner, the pattern can be further treated if desired using heat or exposure to actinic radiation (such as UV, visible, or IR radiation). For example, if the electrically conductive print material contains metal nanoparticles, the pattern of electrically conductive print material can be heated to sinter the particles and render the pattern lines or shapes conductive. Sintering provides a coherent bonded mass from heating a metal powder in the form of metal nanoparticles, without melting. Sintering can be carried out using temperatures and conditions that would be apparent to one skilled in the art. The pattern of print material can alternatively be chemically treated to change its properties, such as conductivity, color, or reflectivity using conditions, materials, and procedures that would be readily apparent to one skilled in the art.

The present invention provides at least the following embodiments and combinations thereof, but other combinations of features are considered to be within the present invention as a skilled artisan would appreciate from the teaching of this disclosure:

1. A method for forming a pattern of a print material on a receiver element comprising a receptive surface, the method comprising the following features:
   (a) providing an elastomeric relief element that comprises a relief pattern comprising (1) an uppermost relief surface, and (2) an average relief image depth of at least 50 µm relative to the uppermost relief surface,
   (b) optionally treating the elastomeric relief element that comprises the relief pattern with an acid in vapor or liquid form,
   (c) applying a printable material composition to the uppermost relief surface of the elastomeric relief element, the printable material composition comprising an electrically conductive print material and a carrier liquid,
   (d) removing at least 50 weight % of the carrier liquid from the printable material composition that is disposed on the uppermost relief surface of the elastomeric relief element, leaving the electrically conductive print material on the uppermost relief surface,
   (e) optionally treating the printable material composition on the uppermost relief surface with an acid in vapor or liquid form to form a reacted electrically conductive print material on the uppermost relief surface,
   provided that the method comprises after feature (a): either at least one feature (b), at least one feature (e), or at least one of both feature (b) and feature (e), and
   (f) transferring the electrically conductive print material after feature (d) if no feature (e) is used, or transferring the reacted electrically conductive print material if feature (e) is used, from the uppermost relief surface to a receptive surface of a receiver element.

2. The method of embodiment 1, comprising only at least one feature (e).

3. The method of embodiment 1 or 2, comprising at least one feature (e) using nitric acid, acetic acid, or hydrochloric acid in vapor or liquid form.

4. The method of any of embodiments 1 to 3, comprising at least one feature (e) but not feature (b) using hydrochloric acid in vapor or liquid form.

5. The method of any of embodiments 1 to 4, comprising at least one feature (e) but not feature (b), and further comprising after feature (a):
repeating features (c) and (d), in the noted sequence, at least once using additional amounts of the same printable material composition and the same elastomeric relief element, to provide an increased amount of electrically conductive print material disposed on the uppermost relief surface.

6. The method of embodiment 5, comprising at least one feature (e) but not feature (b) using hydrochloric acid in vapor or liquid form.

7. The method of embodiment 1 and 3, comprising at least one feature (b) and at least one feature (e) using the same acid in both features (b) and (e).

8. The method of any of embodiments 1 and 7, comprising at least one feature (b) and at least one feature (e) using different acids.

9. The method of any of embodiments 1 to 8, wherein feature (e) is carried out using an acid in vapor form for at least 0.5 seconds at a temperature of at least 20° C.

10. The method of any of embodiments 1 to 9, wherein feature (e) is carried out using an acid present in solution at a concentration of at least 0.001 molar for at least 0.1 second.

11. The method of any of embodiments 1 to 10, comprising in feature (d), removing at least 80 weight % of the carrier liquid from the printable material composition on the uppermost relief surface of the elastomeric relief element.

12. The method of any of embodiments 1 to 11 for providing a pattern of the multilayer structure on the receiver element comprising lines having an average line width of less than 15 μm.

13. The method of any of embodiments 1 to 12, wherein the receiver element has been heated before transferring either the electrically conductive print material or the reacted electrically conductive print material from the uppermost relief surface to the receptive surface of the receiver element, the receiver element being heated to a heating temperature that is higher than the glass transition temperature ($T_g$) of the receptive surface.

14. The method of embodiment 13, comprising transferring either the electrically conductive print material or the reacted electrically conductive print material from the uppermost relief surface to the receptive surface in a manner such that the elastomeric relief element is compressed by at least 10 μm of its original thickness when measured at the heating temperature.

15. The method of any of embodiments 1 to 14 for providing a pattern of a multilayer structure that comprises an electroless seed material for a subsequent electroless plating process.

16. An elastomeric relief element that comprises a relief pattern comprising (1) an uppermost relief surface, and (2) an average relief image depth of at least 50 μm relative to the uppermost relief surface,
the uppermost relief surface having a printable material composition thereon, the printable material composition comprising a reacted electrically conductive reacted print material and a carrier liquid,
wherein:
the reacted electrically conductive print material has been obtained by reaction of an electrically conductive print material on the uppermost relief surface with an acid in vapor or liquid form,
the reacted electrically conductive print material is present in the printable material composition in an amount of at least 25 weight %, and
the printable material composition has a viscosity of at least 100 cps and up to and including 1500 cps.

17. Any of embodiments 1 to 16, wherein the printable material composition has a viscosity of at least 100 cps and up to and including 900 cps.

18. Any of embodiments 1 to 17, wherein the elastomeric relief element is a flexographic printing member and the relief pattern has an average relief image depth of at least 100 μm relative to the uppermost relief surface.

19. Any of embodiments 1 to 18, wherein the electrically conductive print material comprises nanoparticles of an electrically conductive material selected from the group consisting of silver, gold, copper, palladium, platinum, nickel, iron, indium-tin oxide, carbon black, combinations thereof, and precursors thereof.

20. Any of embodiments 1 to 19, wherein the printable material composition comprises a colorant other than the electrically conductive print material.

21. A printed electrically conductive pattern on a receiver element, obtained from a method of any of embodiments 1 to 15, which printed electrically conductive pattern comprises a reacted electrically conductive print material that has been derived by reaction of an electrically conductive print material with an acid in vapor or liquid form.

The following Examples are provided to illustrate the practice of this invention and are not meant to be limiting in any manner. The following materials and procedures were used in general for all of the Examples unless otherwise indicated.

These examples are carried out to provide printed conductive silver patterns on a flexible polymeric substrate (coated or non-coated) using flexographic printing plate precursors prepared as described in U.S. Pat. No. 8,142,987 (noted above) each of which was imaged to provide a relief pattern in a flexographic printing plate as an elastomeric relief element, using a high resolution imaging device.

Each sample of Flexcel™ NX flexographic printing plate precursor having a 1.14 mm total dry thickness, was provided as an elastomeric relief element and imaged to provide a relief pattern having an uppermost relief surface and an average relief image depth of 250 μm containing grid features spaced 400 μm apart and a line width of 6 μm. Each elastomeric relief element was then mounted using 3M brand 1120 adhesive-backed tape onto the plate cylinder of a Flexiproofer™ 100 flexographic printer (obtained from RK PrintCoat Instruments, Ltd., United Kingdom). The total outer diameter of the plate cylinder assembly was 128.5 mm.

A specific ink (printable material composition), as described below and comprising a print material and a carrier liquid, was applied to the uppermost relief surface of each elastomeric relief element using a 1.6 BCM, 1600 lpi Anilox roller at a speed of 50 meters/minute and impression distance of 50 μm. Each ink had a viscosity of at least 100 cps at room temperature, and was applied twice to each elastomeric relief element with an 8 second wait between each ink application to allow room temperature drying of the ink (removing at least 75 weight % of the carrier liquid) after each application.

After the second application of ink, the plate cylinder with the each attached inked elastomeric relief element was removed and impressed against a provided receiver element that had been heated. Each receiver element was a polymer-coated substrate composed of poly(ethylene terephthalate) (PET). The various polymer coatings are described below. Each receiver element was heated by pressing it against a heated silicone rubber-coated print cylinder having a surface hardness of 50 Shore A and a surface temperature of 125° C.

The total outer diameter of this heated silicone rubber-coated print cylinder assembly was 137.8 mm. The plate cylinder assembly was impressed a distance of 0.4 mm into the print cylinder assembly to produce a nip width of 9.5 mm and a 105 µm compression of the elastomeric relief element.

While the plate cylinder assembly and the print cylinder assembly were in compression contact, they were rotated at a linear surface speed of 30 mm/sec. The ink (print material) from each relief pattern on the elastomeric relief element uppermost surface was transferred under these conditions to the heated surface of the respective receiver element, and the elastomeric relief element was compressed by a certain amount, that is at least certain µm of its original thickness when measured at 25° C. The amounts of compression for some of the experiments are described below. After separation of the elastomeric relief element and the receiver element, the printed pattern of ink on the receiver element was then oven-cured at 105° C. for 5 minutes. This curing is not essential to the invention but it can provide additional benefits of improved conductivity and adhesion to the receiver element surface. For these embodiments, at least 80 weight % of the print material originally disposed on the uppermost relief surface of the elastomeric relief element was transferred to the heated receiver element.

PChem Ink PFI-722, obtained from PChem Associates (Bensalem, Pa.) and InkTec TEC-PR-030 nanoink from Ink-Tec Corp Gyeonggi-Do (Korea) were used as conductive silver-containing printable material compositions (inks) in the Examples described below.

Coated films of poly(ethylene terephthalate) (PET) were prepared as receiver elements as shown below in TABLES I and II. Each coating was applied in at a coverage of either 50 mg/ft$^2$ (540 mg/m$^2$) or 30 mg/ft$^2$ (324 mg/m$^2$)]. The various coatings are identified as follows:

Carboset® 525 and 527 are commercial acrylate polymers that are available from Lubrizol Corporation.

In the Examples described in TABLE I, various features of receiver elements and formation of printed patterns ("Receiver Element Effects") were evaluated.

Transfer Speed (m/min) refers to linear surface speed through the nip of impression rollers used for lamination.

Impression Effect (mm) refers to the impression distance between rollers past just touching impression.

Solid resistivity (ohm/sq) refers to surface resistivity of solid area deposits of ink 8 mm in diameter, as measured using Surface Resistivity Meter SRM-232 (Guardian Manufacturing Inc.).

Grid resistivity (ohm/sq) refers to surface resistivity of grid patterns of conductive ink and was measured by an ohm meter across a length 104 mm long and 4 mm wide (26 squares).

Line width (µm) was measured by optical microscopy and was the average of seven measurements.

% Ink Transferred (INKtran) refers to the amount of ink that was transferred from the elastomeric relief element to a specific heated receiver element, and was determined by measuring the transmission optical absorbance or density (TOD) (using an ortho filter of an X-Rite 360 Transmission densitometer) of the printable material on the receiver element and the residual printable material composition (INKres) on the elastomeric relief element after contact transfer. The % ink transferred (% INKtran) is calculated as:

INKtran=TOD INKtran/(TOD INKtran+TOD INKres)

Figure 2:
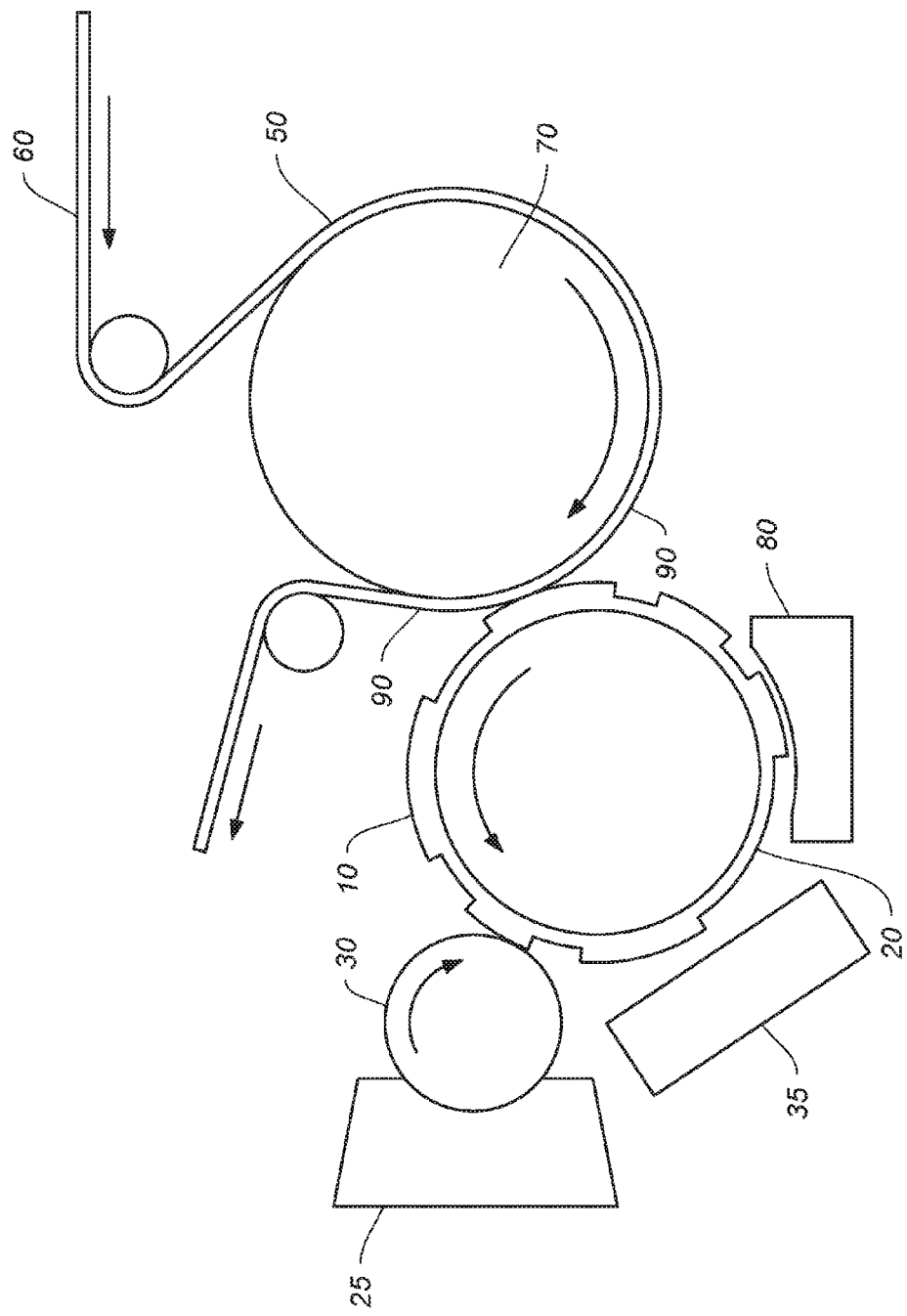

Unless otherwise indicated, all of the Examples were carried out using an apparatus or system that is schematically described as roll-to-roll equipment, as depicted in FIG. 1 or 2, which is not intended to be limiting as to the apparatus means that can be used to practice the present invention.

As illustrated in FIG. 1, elastomeric relief element 10 was provided on plate roller 20. A printable material composition ("ink") was applied to the uppermost relief surface of elastomeric relief element 10 using ink chamber 25 and Anilox inking system 30 as a suitable application means. The printable material composition comprised a print material and carrier liquid, and for some embodiments, a certain portion of the carrier liquid was removed from the printable material composition using ink dryer 35 that was arranged close to elastomeric relief element 10. Elastomeric relief element 10 was subsequently contacted with acid bath roller 40 that delivers acid from acid bath 45 and then passed by acid dryer 55. Receiver element 50 was brought into the apparatus on a suitable path 60 and heated on heated roller 70 at a suitable temperature and time, and then brought into contact with the printable material composition disposed on the uppermost relief surface of elastomeric relief element 10. Elastomeric relief element 10 was then separated from heated receiver element 90 after transferring the printable material composition to heated relief element 90. The arrows in FIG. 1 show the direction of path 60 as well as the direction of rotation of various components of the apparatus.

Now referring to FIG. 2, elastomeric relief element 10 was provided on plate roller 20. A printable material composition ("ink") was applied to the uppermost relief surface of elastomeric relief element 10 using ink chamber 25 and Anilox inking system 30 as a suitable application means. The printable material composition comprised a print material and carrier liquid, and for some embodiments, a certain portion of the carrier liquid was removed from printable material composition using ink dryer 35 that was arranged close to elastomeric relief element 10. Elastomeric relief element 10 was subsequently exposed to acid vapor using acid vapor treatment station 80. Receiver element 50 was brought into the apparatus on suitable path 60 and heated on heated roller 70 at a suitable temperature and time, and then brought into contact with the printable material composition (ink) disposed on the uppermost relief surface of elastomeric relief element 10. Elastomeric relief element 10 was then separated from heated receiver element 90 after transferring the printable material composition (ink) to heated relief element 90. The arrows in FIG. 2 show the direction of path 60 as well as the direction of rotation of various components of the apparatus.

INVENTION EXAMPLE 1

The general procedure described above was followed and the PChem PFI-722 ink was applied two times to an elastomeric relief element as described PFI-722 above with a wait of 8 seconds between applications. While the PChem PFI-722 ink was still on the elastomeric relief element, the elastomeric relief element was removed from an adhered backing and one half of the elastomeric relief element was exposed to HCl vapor for 30 seconds. While still on the uppermost relief surface, the PChem PFI-722 ink had a measured resistivity in the range of a few ohms/square (no heating). The PChem ink PFI-722 was then transferred to a Carboset® 525-coated receiver element as described above. The PChem PFI-722 ink that had been exposed to HCl vapor on half of the elastomeric relief element was completely (100%) transferred while only 82% of the PChem PFI-722 ink that had not been exposed to the HCl vapor was transferred.

The following TABLE I shows the experimental conditions and results for Invention Example 1.

TABLE I

Speed and Temperature Effects

| | Receiver Element | Transfer Speed (m/min) | Impression (mm) | Solid Resistivity (Ohm/sq) | Grid Resistivity (Ohm/sq) | Comments on lines | Line width (μm) | % Ink Transferred |
|---|---|---|---|---|---|---|---|---|
| Invention Example 1: Half exposed to HCl vapor | Carboset ® 525 | 1.5 | 0.4 | 0.23 | 9.5 | Sharp lines | 6.0 | 100 |
| Comparison Example 1: Half without HCl vapor exposure | Carboset ® 525 | 1.5 | 0.4 | 0.25 | 15.2 | Sharp lines | 6.0 | 85 |

The results shown in TABLE I indicate that the % ink transferred from the elastomeric relief element to the receiver element was significantly improved by treating the printable material composition (ink) with an acid according to the method of the present invention.

INVENTION EXAMPLE 2

Inktec Tec-PR-030 was applied as a printable material composition (ink) to an elastomeric relief element as described above with a wait of 8 seconds between applications. This ink typically exhibited good transfer to receiver elements but it also exhibited less conductivity. When tested by exposing half of the inked elastomeric relief element to HCl vapor as in Invention Example 1, conductivity was measured on the HCl vapor exposed half but no measureable conductivity was measured on the half that was not exposed to the HCl vapor. The printable material composition (ink) was completely (100%) transferred from the HCl-exposed half of the elastomeric relief element. The results are shown below in TABLE II.

INVENTION EXAMPLE 3

In this example the elastomeric relief element having PChem PFI-722 ink on the uppermost relief surface was immersed in a bath of 10% concentrated HCl in deionized water for 10 seconds and then removed. The elastomeric relief element was then held lightly against a paper towel to remove excess acidic solution and then the PChem PFI-722 ink was transferred to a receiver element as described above. It was found that 100% of the PChem PFI-722 ink was transferred to the receiver element and lower resistivity (higher conductivity) was measured in the transferred PChem PFI-722 ink compared to the sample that was not treated with the HCl solution. The results are shown below in TABLE II.

INVENTION EXAMPLES 4-5

The PChem PFI-722 ink as described above was printed using the Flexiproof 100 at an application speed of 50 m/min (2 applications and 1.6 BCM Anilox). The elastomeric relief element was left on the roller, mounted in the flat bed system and then transferred to a heated receiver element using the various conditions described below in TABLE II. The metal hot plate holder for the receiver element was heated to 107° C. surface temperature. The total force across the nominal 3 inch (7.6 cm) wide element was measured. It should be noted that variations in image content changes the localized pressure significantly. The nip width of 6 to 8 mm was measured using the 400 μm grid across the width of the roller. All treated elastomeric relief element samples were soaked at 120° C. for 5 minutes after transfer of the printable material composition (ink). A summary of the experimental conditions and results are summarized below in TABLE II.

The applied printable material compositions on the elastomeric relief element were treated with vapor above a beaker of either acetic acid or HCl for 10-20 seconds before the printable material compositions were transferred to the heated receiver element. The results shown in TABLE II clearly show that this acid treatment provided greatly improved transfer of the printable material composition to the receiver element.

TABLE II

Speed & Temperature Effects

| Example | Receiver Element | Transfer Speed (m/min) | Force (g/cm) | Treatment | Solid Resistivity (Ohm/sq) | % Transfer |
|---|---|---|---|---|---|---|
| Comparison 2 | Carboset ® 527 coated PET | 1.8 | 780 | None | 0.4 | ~80% |
| Comparison 3 | Carboset ® 527 coated PET | 1.8 | 780 | None | 0.4 | ~80% |
| Invention 2 | Carboset ® 527 coated PET | 1.8 | 780 | HCl vapor | 0.28 | 100% |
| Invention 3 | Carboset ® 527 coated PET | 1.8 | 780 | Acetic acid vapor | 0.5 | 100% |
| Invention 4 | Carboset ® 527 coated PET | 1.8 | 780 | Acetic acid vapor | 0.35 | 100% |
| Invention 5 | Carboset ® 527 coated PET | 1.8 | 780 | Acetic acid vapor | 0.4 | 100% |

The invention has been described in detail with particular reference to certain preferred embodiments thereof, but it will be understood that variations and modifications can be effected within the spirit and scope of the invention.

PARTS LIST

10 Elastomeric relief element
20 Plate roller
25 Ink chamber
30 Anilox inking system
35 Ink dryer
40 Acid bath roller
45 Acid bath
50 Receiver element
55 Acid dryer
60 Path
70 Heated roller
80 Acid vapor treatment station
90 Heated receiver element

The invention claimed is:

1. A method for forming a pattern of a print material on a receiver element comprising a receptive surface, the method comprising the following features:
   (a) providing an elastomeric relief element that comprises a relief pattern comprising (1) an uppermost relief surface, and (2) an average relief image depth of at least 50 μm relative to the uppermost relief surface,
   (c) applying a printable material composition to the uppermost relief surface of the elastomeric relief element, the printable material composition comprising an electrically conductive print material and a carrier liquid,
   (d) removing at least 50 weight % of the carrier liquid from the printable material composition that is disposed on the uppermost relief surface of the elastomeric relief element, leaving the electrically conductive print material on the uppermost relief surface,
   (e) treating the printable material composition on the uppermost relief surface with an acid in vapor or liquid form to form a reacted electrically conductive print material on the uppermost relief surface, and
   (f) transferring the reacted electrically conductive print material from the uppermost relief surface of the elastomeric relief element to a receptive surface of a receiver element,
   carrying out at least one feature (e), and
   repeating features (c) and (d), in the noted sequence, at least once using additional amounts of the same printable material composition and the same elastomeric relief element, to provide an increased amount of electrically conductive print material disposed on the uppermost relief surface.

2. The method of claim 1, comprising at least one feature (e) using nitric acid, acetic acid, or hydrochloric acid in vapor or liquid form.

3. The method of claim 1, comprising at least one feature (e) using hydrochloric acid in vapor or liquid form.

4. The method of claim 1, wherein feature (e) is carried out using an acid in vapor form for at least 0.5 seconds at a temperature of at least 20° C.

5. The method of claim 1, wherein feature (e) is carried out using an acid present in solution at a concentration of at least 0.001 molar for at least 0.1 second.

6. The method of claim 1, comprising in feature (d), removing at least 80 weight % of the carrier liquid from the printable material composition on the uppermost relief surface of the elastomeric relief element.

7. The method of claim 1, wherein the printable material composition has a viscosity of at least 100 cps and up to and including 900 cps.

8. The method of claim 1, wherein the elastomeric relief element is a flexographic printing member and the relief pattern has an average relief image depth of at least 100 μm relative to the uppermost relief surface.

9. The method of claim 1, wherein the electrically conductive print material comprises nanoparticles of an electrically conductive material selected from the group consisting of silver, gold, copper, palladium, platinum, nickel, iron, indium-tin oxide, carbon black, combinations thereof, and precursors thereof.

10. The method of claim 1, wherein the printable material composition comprises a colorant other than the electrically conductive print material.

11. The method of claim 1 for providing a pattern of the electrically conductive print material on the receiver element comprising lines having an average line width of less than 15 μm.

12. The method of claim 1 for providing a pattern of a multilayer structure that comprises an electroless seed material for a subsequent electroless plating process.

13. The method of claim 1, wherein the receiver element has been heated before transferring either the electrically conductive print material or the reacted electrically conductive print material from the uppermost relief surface to the receptive surface of the receiver element having a glass transition temperature ($T_g$), the receiver element being heated to a heating temperature that is higher than the glass transition temperature ($T_g$) of the receiver element.

14. The method of claim 13, comprising transferring either the electrically conductive print material or the reacted electrically conductive print material from the uppermost relief surface of the elastomeric relief element to the receptive surface in a manner such that the elastomeric relief element is compressed by at least 10 μm of its original thickness when measured at the heating temperature.

* * * * *